United States Patent
Dimayuga et al.

(10) Patent No.: US 9,824,979 B2
(45) Date of Patent: Nov. 21, 2017

(54) ELECTRONIC PACKAGE HAVING ELECTROMAGNETIC INTERFERENCE SHIELDING AND ASSOCIATED METHOD

(71) Applicant: STMICROELECTRONICS, INC., Calamba, Laguna (PH)

(72) Inventors: Godfrey Dimayuga, San Pablo (PH); Frederick Arellano, Pulo Cabuyao Laguna (PH); Michael Tabiera, Laguna (PH)

(73) Assignee: STMICROELECTRONICS, INC., Calamba, Laguna (PH)

( * ) Notice: Subject to any disclaimer, the term of this patent is extended or adjusted under 35 U.S.C. 154(b) by 4 days.

(21) Appl. No.: 14/982,018

(22) Filed: Dec. 29, 2015

(65) Prior Publication Data
US 2017/0186698 A1    Jun. 29, 2017

(51) Int. Cl.
| | |
|---|---|
| H01L 23/552 | (2006.01) |
| H01L 21/56 | (2006.01) |
| H01L 23/31 | (2006.01) |
| H01L 23/00 | (2006.01) |

(52) U.S. Cl.
CPC ......... *H01L 23/552* (2013.01); *H01L 21/563* (2013.01); *H01L 23/3114* (2013.01); *H01L 23/3128* (2013.01); *H01L 24/43* (2013.01); *H01L 24/49* (2013.01); *H01L 24/85* (2013.01); *H01L 24/97* (2013.01); *H01L 2224/32225* (2013.01); *H01L 2224/48227* (2013.01); *H01L 2224/48249* (2013.01); *H01L 2224/73265* (2013.01); *H01L 2224/92247* (2013.01); *H01L 2224/97* (2013.01); *H01L 2924/15311* (2013.01)

(58) Field of Classification Search
None
See application file for complete search history.

(56) References Cited

U.S. PATENT DOCUMENTS

| | | | | |
|---|---|---|---|---|
| 5,639,989 A | * | 6/1997 | Higgins, III | ......... H01L 23/552 174/386 |
| 6,351,030 B2 | | 2/2002 | Havens et al. | |
| 7,030,469 B2 | * | 4/2006 | Mahadevan | ......... H01L 21/561 257/659 |
| 7,109,410 B2 | | 9/2006 | Arnold et al. | |
| 7,514,774 B2 | | 4/2009 | Leung et al. | |
| 7,851,894 B1 | | 12/2010 | Scanlan | |

(Continued)

FOREIGN PATENT DOCUMENTS

| | | |
|---|---|---|
| EP | 2 752 872 | 7/2014 |
| WO | 2014/063281 | 5/2014 |

*Primary Examiner* — Michael Lebentritt
*Assistant Examiner* — Jordan Klein
(74) *Attorney, Agent, or Firm* — Slater Matsil, LLP

(57) ABSTRACT

An electronic package includes a substrate having opposing first and second surfaces. Conductive areas are on a first surface of the substrate and include at least one edge conductive area. A plurality of conductive bumps are on the second surface of the substrate and coupled to respective ones of the conductive areas. An integrated circuit (IC) is carried by the substrate. Bond wires are coupled between the IC and respective ones of the conductive areas. An encapsulating material is over the IC and adjacent portions of the substrate. A conductive layer is on the encapsulating material, and at least one conductive body is coupled between the at least one edge conductive area and the conductive layer.

20 Claims, 5 Drawing Sheets

(56) References Cited

U.S. PATENT DOCUMENTS

| | | | | |
|---|---|---|---|---|
| 7,898,066 B1* | 3/2011 | Scanlan | H01L 24/97 | 257/422 |
| 8,018,033 B2* | 9/2011 | Moriya | H01L 23/29 | 257/659 |
| 8,084,300 B1* | 12/2011 | San Antonio | H01L 21/568 | 257/E21.602 |
| 8,576,574 B2 | 11/2013 | Wong et al. | | |
| 8,748,230 B2* | 6/2014 | Welch | H01L 21/56 | 257/692 |
| 9,165,899 B2* | 10/2015 | Joh | H01L 23/49811 | |
| 9,236,356 B2* | 1/2016 | Yang | H01L 23/49838 | |
| 2004/0178500 A1* | 9/2004 | Usui | H01L 23/49822 | 257/734 |
| 2006/0145361 A1* | 7/2006 | Yang | H01L 23/3121 | 257/787 |
| 2008/0272469 A1* | 11/2008 | Kwak | H01L 21/561 | 257/659 |
| 2009/0194852 A1* | 8/2009 | Chiu | H01L 21/568 | 257/660 |
| 2009/0212401 A1* | 8/2009 | Do | H01L 21/56 | 257/659 |
| 2009/0315156 A1* | 12/2009 | Harper | H01L 23/552 | 257/660 |
| 2010/0013064 A1* | 1/2010 | Hsu | H01L 23/055 | 257/660 |
| 2011/0261550 A1* | 10/2011 | Wong | H01L 21/561 | 361/818 |
| 2012/0052630 A1* | 3/2012 | Lin | H01L 21/561 | 438/108 |
| 2012/0168214 A1* | 7/2012 | Kashiwagi | H01L 23/3121 | 174/257 |
| 2012/0243191 A1* | 9/2012 | Wu | H05K 1/0218 | 361/760 |
| 2015/0235927 A1* | 8/2015 | Bauer | H01L 23/552 | 257/675 |
| 2016/0172309 A1* | 6/2016 | Gong | H01L 24/97 | 257/659 |

* cited by examiner

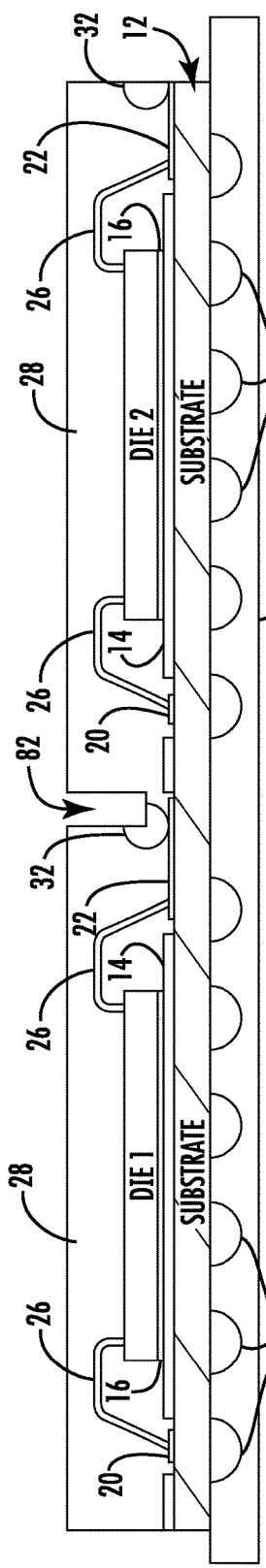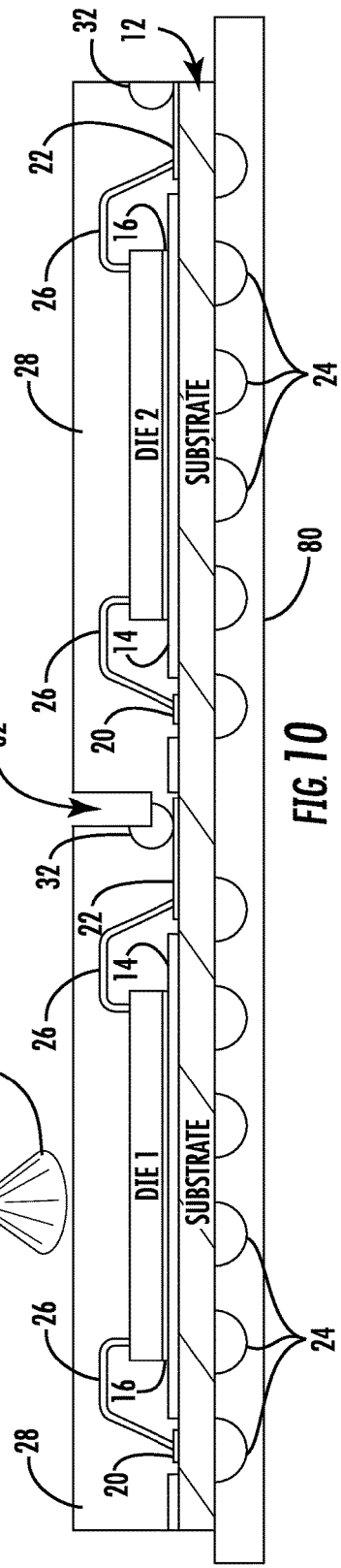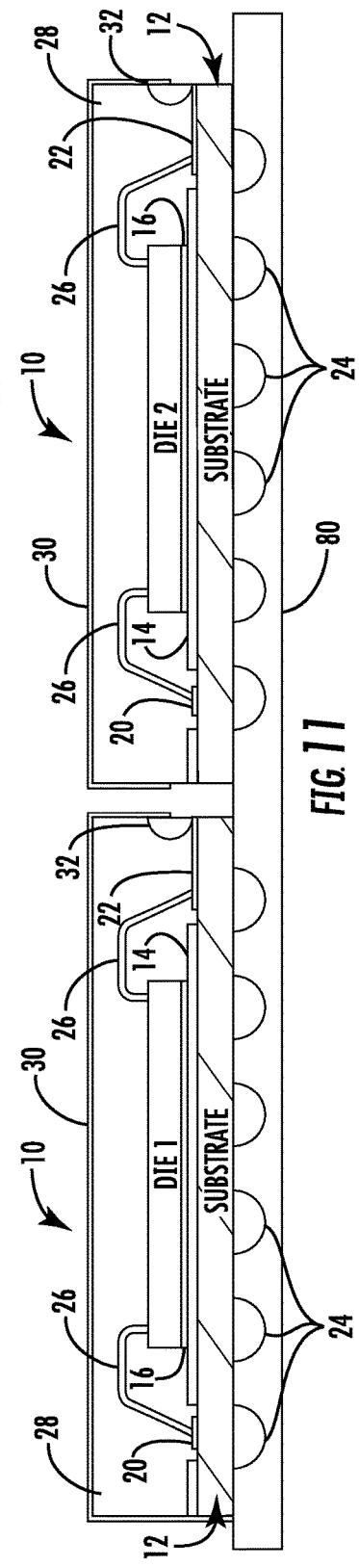

ELECTRONIC PACKAGE HAVING ELECTROMAGNETIC INTERFERENCE SHIELDING AND ASSOCIATED METHOD

TECHNICAL FIELD

The present disclosure relates to electronic packages, and more particularly, the present disclosure relates to an electronic package having a conductive layer on an encapsulating material for electromagnetic interference (EMI) shielding.

BACKGROUND

Electronic devices commonly use electromagnetic interference (EMI) shielding to prevent disruption of their performance resulting from electromagnetic fields present in the operating environment. Some electronic devices incorporate a metal container or "can" that surrounds the electronic device to form an electromagnetic shield, which is electrically connected to a ground in the device. This shield attenuates the EMI field before it reaches the device. Other EMI isolation systems use metal plates that fit over board-mounted electronic devices. Packaged electronic devices that include an integrated circuit (IC), such as a ball grid array (BGA) electronic package, may include on the package a metal film deposited by sputtering or chemical vapor deposition (CVD). This metal film is electrically connected to a ground conductor layer, such as extending under the IC to a wall of the package, to isolate the IC from electromagnetic interference.

In another example, conductive paint that has metal particles suspended in a fluidic carrier is sprayed onto the exterior surface of the electronics package, for example, a ball grid array package. The sprayed conductive paint is cured to remove the fluidic carrier, leaving a metal film coated to the outside of the electronic package. Grooves are cut into the surface, such as in the encapsulation material, to expose the conductive paint to a ground conductor circuit located at a ground conductor layer. This system may require a ground conductor layer in the package that extends to the package perimeter. Other EMI shielding systems for electronic packages use wire bonding from the IC to a shield layer on the package. These techniques may increase manufacturing complexity and raise costs.

SUMMARY

An electronic package comprises a substrate having opposing first and second surfaces. A plurality of conductive areas are on a first surface of the substrate. The plurality of conductive areas may comprise at least one edge conductive area at an edge of the substrate. A plurality of conductive bumps are on the second surface of the substrate and coupled to respective ones of the plurality of conductive areas. An integrated circuit (IC) is carried by the substrate. A plurality of bond wires are coupled between the IC and respective ones of the plurality of conductive areas. An encapsulating material is over the IC and adjacent portions of the substrate. A conductive layer is on the encapsulating material, and at least one conductive body may be coupled between the at least one edge conductive area and the conductive layer.

The at least one edge conductive area may comprise a ground trace on the substrate. The electronic package may comprise a ball grid array electronic package. The conductive layer on the encapsulating material may comprise a conductive paint. The conductive layer on the encapsulating material may comprise a silver coating. The silver coating may have a thickness from 5 to 15 microns. The at least one conductive body may comprise a ball bond and in an example, a plurality of ball bonds. The conductive layer may have a resistance no greater than 5 ohms per square.

A method of forming an electronic package may comprise forming a plurality of conductive areas on a first surface of a substrate. The plurality of conductive areas may comprise at least one edge conductive area at an edge of the substrate. The method includes forming at least one conductive body on the at least one edge conductive area and forming a plurality of conductive bumps on the second surface of the substrate and coupled to respective ones of the plurality of conductive areas. The method further includes coupling a plurality of bond wires between an integrated circuit (IC) carried by the substrate and respective ones of the plurality of conductive areas. The method includes forming an encapsulating material over the IC and adjacent portions of the substrate, and forming a conductive layer on the encapsulating material coupled to the at least one edge conductive area by the at least one conductive body.

BRIEF DESCRIPTION OF THE DRAWINGS

Other features and advantages will become apparent from the detailed description of which follows, when considered in light of the accompanying drawings in which:

FIG. 9 is a sectional view showing a saw kerf made in the encapsulating material to expose a portion of the conductive body as a ball bond in accordance with a non-limiting example.

FIG. 10 is a sectional view showing the conductive layer sprayed onto the encapsulating material and into the saw kerf in accordance with a non-limiting example.

FIG. 11 is a sectional view showing the final cutting to singulate the electronic packages in accordance with a non-limiting example.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

Figure 1:
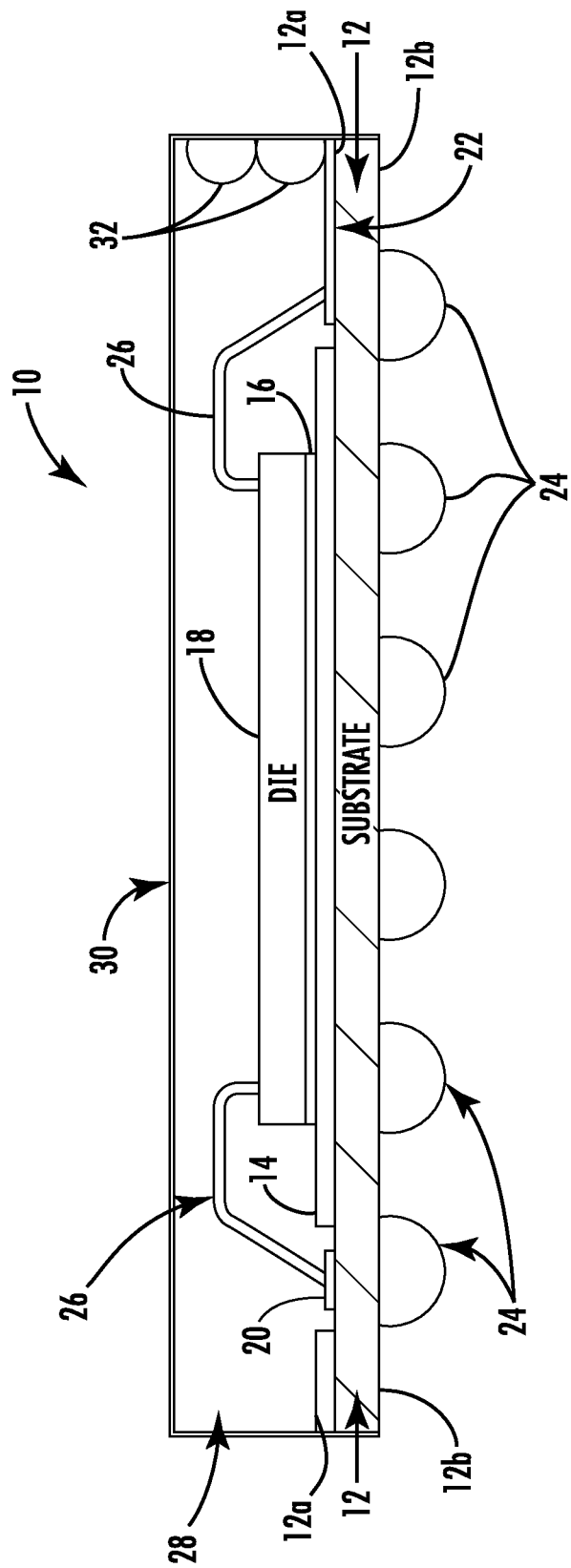
FIG. 1 is a sectional view of the electronic package showing the conductive body coupled between at least one edge conductive area and the conductive layer in accordance with a non-limiting example.

An example electronic package is shown generally at 10 in FIG. 1. As illustrated, the electronic package 10 is formed as a ball grid array electronic package. Other package designs could be used, including a land grid array, dual-in-line package (DIP), quad flat package (QFP), or flip chip. The electronic package 10 includes a dielectric substrate 12 having first and second surfaces 12a,12b and includes one or more conductive layers, feedthroughs or coated vias for interconnection as is well-known in the art. A metallization layer 14 is carried by the substrate 12 on its first surface 12a and includes a die attach layer 16 on which an integrated circuit (IC) 18 as a die is carried by the substrate. A plurality of conductive areas 20 are on the first surface 12a of the substrate 12 and in an example are formed as wire bonding areas. These conductive areas 20 include at least one edge conductive area 22 at an edge of the substrate 12 and formed as a ground trace in this example. A plurality of conductive bumps 24 are formed as solder balls on the second surface 12b of the substrate 12 and coupled to respective ones of the plurality of conductive areas 20 using the different conductive layers, feedthroughs, conductive vias, or other techniques known to those skilled in the art. A plurality of bond wires 26 are coupled between the IC 18 and respective ones of the plurality of conductive areas 20 and edge conductive area 22. An encapsulating material 28 is formed over the IC 18 and adjacent portions of the substrate 12. Different materials may be used for the encapsulating material 28 as known to those skilled in the art.

As illustrated, a conductive layer 30 is formed on the encapsulating material 28. At least one conductive body 32 is coupled between the at least one edge conductive area 22 and the conductive layer 30. In this illustrated embodiment, the at least one conductive body 32 is formed as a ball bond and as shown, a plurality of ball bonds are used with two ball bonds illustrated in FIG. 1. The ball bonds 32 are positioned at the edge of the semiconductor package 10 over the edge conductive area 22 and exposed by cutting into the encapsulation material 28 and partially into the ball bond. The exposed portion of the ball bond 32 is then coated by the conductive layer 30. As explained in greater detail below, the ball bonds 32 may be formed by using wire bonding techniques in which the ball bond is formed on the edge conductive area 22 using heat and the wire subsequently removed to leave the ball bond intact. The conductive body 32 may also be formed by solder ball placement using existing techniques.

The conductive layer 30 on the encapsulating material 28 may be formed from different materials and have different thicknesses to shield the IC 18 from EMI or to prevent EMI from being radiated from the package. In one example, the conductive layer 30 is a silver coating having a thickness from 5 to 15 microns. It is also possible to use a conductive paint that is sprayed on the encapsulating material 28. The conductive paint may include metal particles suspended in a fluidic carrier, which is subsequently dried. The conductive paint may include different metallic particles, including but not limited to, copper, silver, stainless steel, nickel, and other conductive particles to impart an EMI shielding effect. This conductive layer 30, in one example, has a resistance no greater than 5 ohms per square, but can vary depending on design and performance requirements for the electronic package 10. The conductive body 32 as a ball bond is connected at the edge conductive area 22 of the substrate 12 at the edge of the electronic package 10 and exposed by cutting after package encapsulation and shorted to the conductive layer 30 by the silver or other conductive coating that is typically sprayed onto the encapsulation material 28 after cutting.

Figure 2:
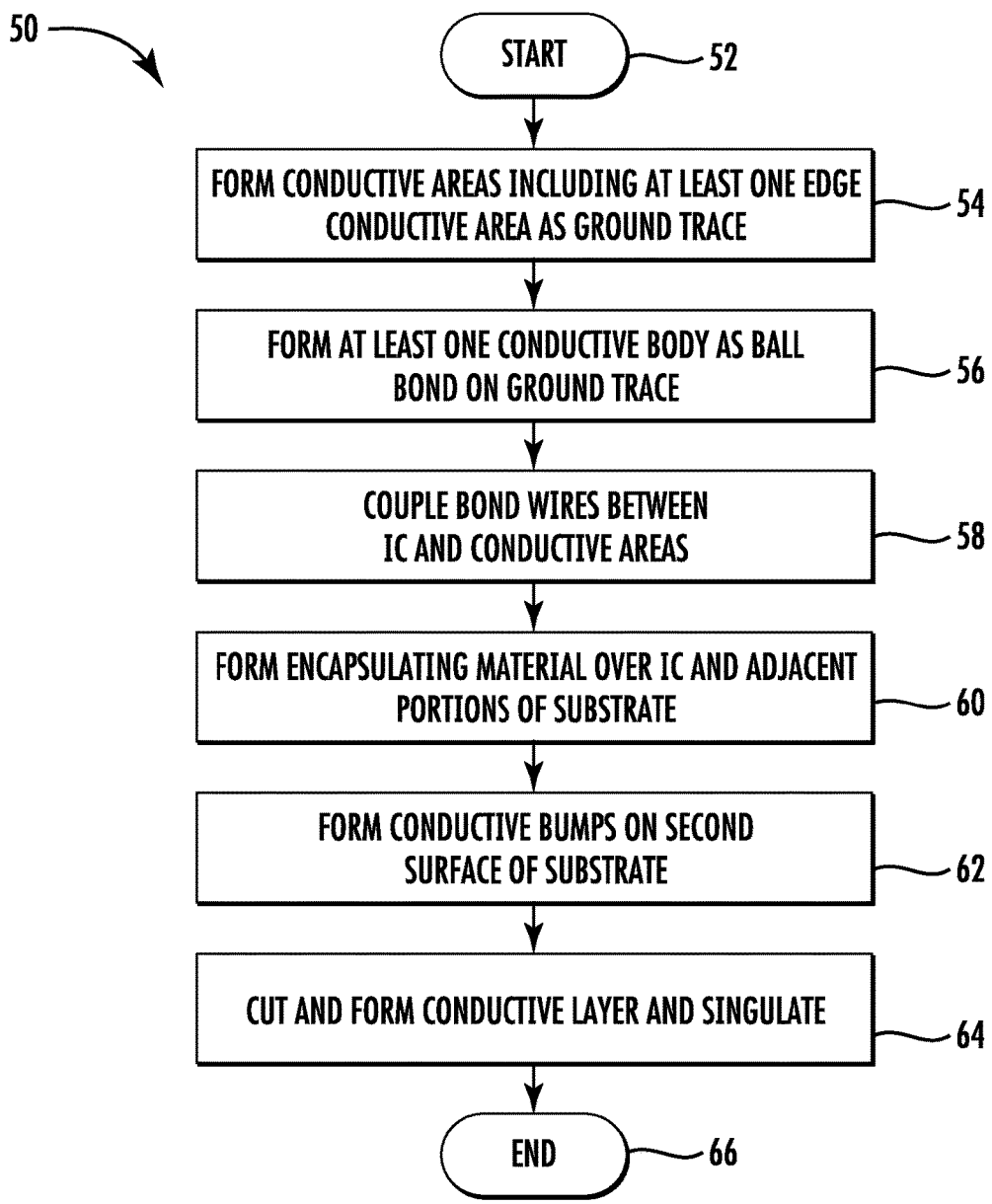
FIG. 2 is a high level flowchart showing a method of forming the electronic package in accordance with a non-limiting example.

An example manufacturing method is shown at 50 in FIG. 2. The process starts at Block 52. A plurality of conductive areas 20 are formed on the first surface 12a of the substrate 12, including at least one edge conductive area 22 as a ground trace (Block 54). At least one conductive body as a ball bond 32, in an example, is formed on the ground trace at the edge conductive area 22 (Block 56).

A plurality of bond wires are coupled between the IC 18 carried by the substrate 12 and respective ones of the conductive areas 20 (Block 58). An encapsulating material 28 is formed over the IC 18 and adjacent portions of the substrate 12 (Block 60). A plurality of conductive bumps 24 as solder balls, in an example, are formed on the second surface 12b of the substrate 12 and coupled to respective ones of the plurality of conductive areas 20 (Block 62) such as by the conductive layers, interconnects and coated vias formed in the substrate 12 as known to those skilled in the art.

The encapsulating material is cut to expose the ball bonds and a conductive layer 30 is formed on the encapsulating material 28 and the at least one conductive body 32. As a result, the ball bond 32 is coupled between the at least one edge conductive area 22 and the conductive layer 30, followed by cutting so that the packages are separated or "singulated" (Block 64). The process ends at Block 66.

FIGS. 3-11 show a sequence of manufacturing steps for the electronic package 10 in accordance with a non-limiting example. Two IC as Die 1 and Die 2 are illustrated on the substrate 12. It should be understood that other numbers of IC's 18 may be attached onto a single large substrate 12, which is subsequently cut or "singulated" into individual electronic packages 10 as explained below.

Figure 3:
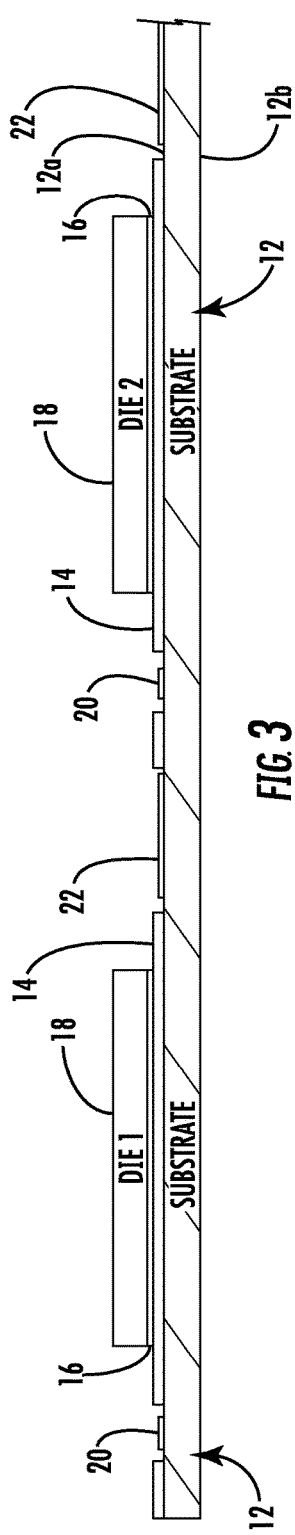
FIG. 3 is a sectional view showing the attachment of the IC to the substrate in manufacturing the electronic package in accordance with a non-limiting example.
Figure 4:
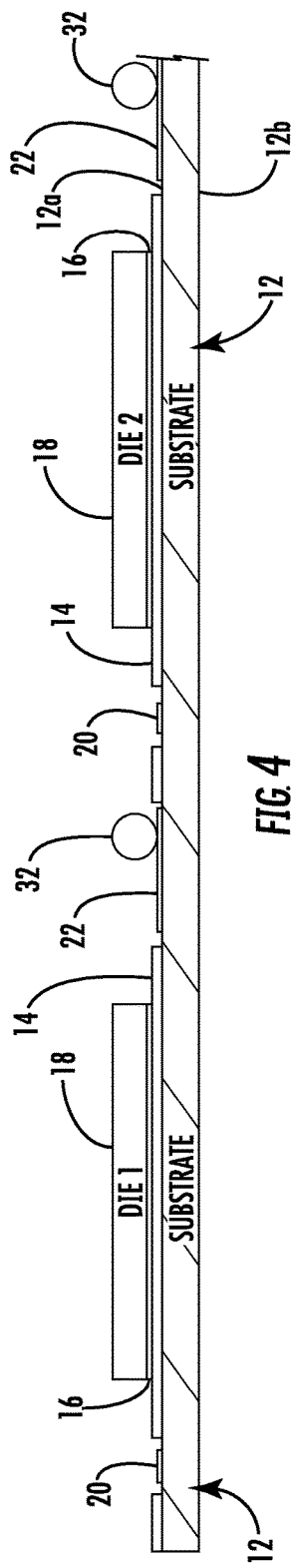
FIG. 4 is a sectional view showing the attachment of at least one conductive body as a ball bond in accordance with a non-limiting example.

FIG. 3 shows the substrate 12 with the two IC as Die 1 and Die 2 carried by the substrate on the die attach layer 16, which is applied over a metallization layer 14. Also illustrated are conductive areas 20 and the edge conductive area 22. This area near the edge conductive area 22 becomes the edge of the substrate 12 for the electronic package 10 after cutting and singulation into separate electronic packages as described further below. A conductive body as a ball bond 32 is positioned on the edge conductive area 22 (FIG. 4). As noted before, a plurality of conductive bodies as ball bonds 32 may be formed such as by wire bonding techniques and the wire subsequently removed, or formed by placing solder bumps or balls on the edge conductive area 22. In the example of FIG. 4 and subsequent drawing figures, only one ball bond 32 is shown on each edge conductive area 22. It should be understood that a plurality of ball bonds, e.g., two or more as shown in FIG. 1 may be used. FIG. 1 shows the electronic package 10 having two ball bonds 32 stacked on each other to give greater surface area coverage to engage a conductive layer 30 for EMI shielding.

Figure 5:
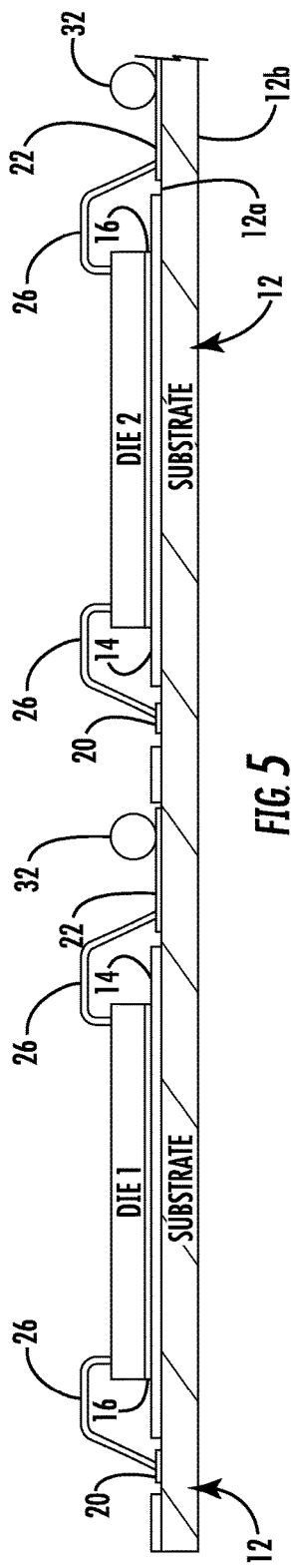
FIG. 5 is a sectional view showing the wire bonding between the IC and respective ones of a plurality of conductive areas in accordance with a non-limiting example.
Figure 6:
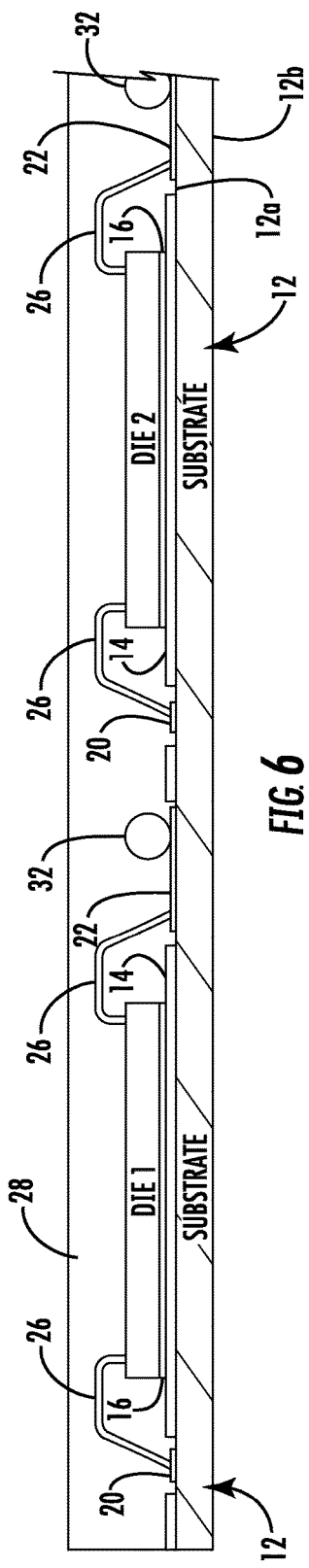
FIG. 6 is a sectional view showing the molding of the encapsulating material over the IC and substrate in accordance with a non-limiting example.
Figure 7:
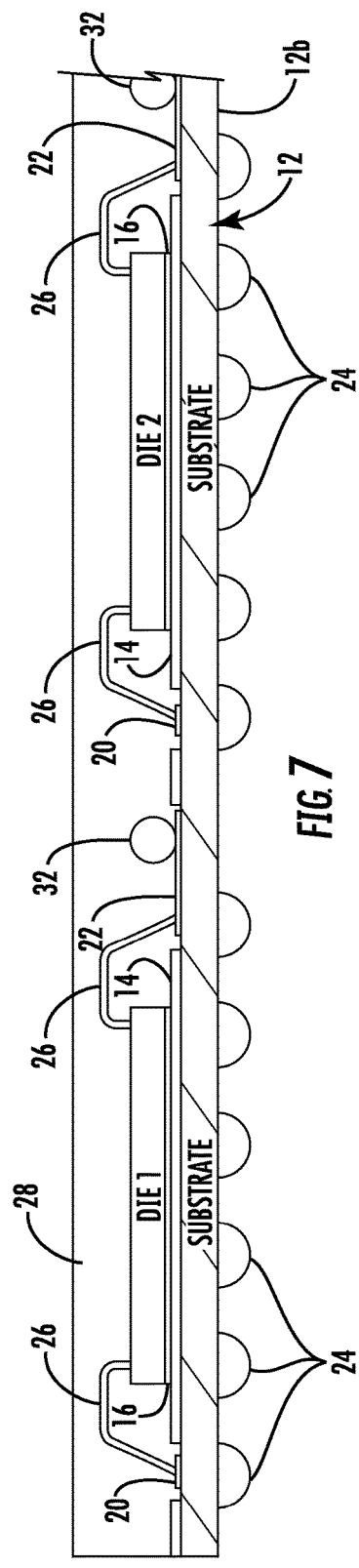
FIG. 7 is a sectional view showing the conductive bumps attached on the second surface of the substrate in accordance with a non-limiting example.
Figure 8:
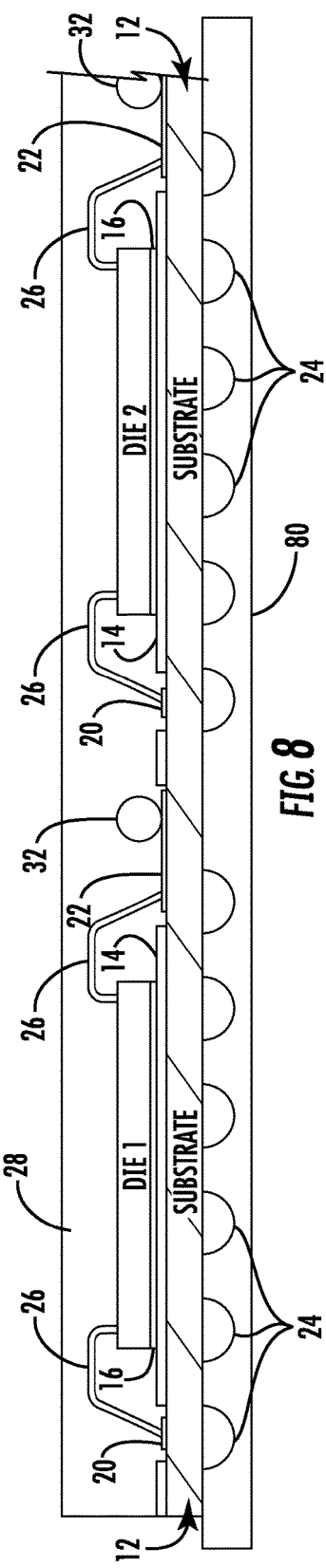
FIG. 8 is a sectional view showing the mounting of tape over the conductive bumps for use with pick-and-place equipment in accordance with a non-limiting example.

FIG. 5 shows a wire bonding process where a plurality of bond wires 26 are coupled between the IC 18 and respective ones of the plurality of conductive areas 20. This is followed by molding and applying an encapsulation material 28 over the IC 18 to cover all bond wires 26, the IC 18 and ball bonds as the conductive bodies 32 (FIG. 6). The conductive bumps 24 are formed on the second surface 12b of the substrate 12 (FIG. 7) and coupled to respective ones of the plurality of conductive areas 20 using conductive layers, feedthroughs, and/or coated vias as known to those skilled in the art. Different techniques can be used to attach the conductive bumps 24 to the substrate 10 such as applying solder balls or other conductive bumps as known to those skilled in the art.

A tape 80 is mounted at the second surface 12b of the substrate 12 onto the conductive bumps 24 and used as a carrying medium for the later cut and singulated individual electronic packages 10 that are attached to a circuit board or other substrate using pick-and-place machinery or using similar manufacturing techniques as known to those skilled in the art. This is followed by a pre-cut (FIG. 9) with mechanical saw to form a saw kerf 82 between the two IC 18 corresponding to the future side edge of each package 10. The saw kerf 82 is usually less than about 200 microns in width and depth in some examples and ranges from 50 to 100 microns in width and depth, but extends partially through each conductive body as the ball bond 32 as illustrated. The conductive layer 30 is formed on the encapsulating material 28 (FIG. 10) such as by spraying a layer of silver onto the encapsulating material. The silver extends into the saw kerf 82 over the exposed section of the ball bond 32. Each electronic package 10 is cut and singulated by cutting through the rest of the substrate 12, for example, by using a laser that is more precise and will not damage the conductive layer 30. The tape 80 remains intact for use with pick-and-place equipment or other electronic packaging machinery (FIG. 11).

This process as described provides an efficient technique for applying EMI shielding to an electronic package 10, such as a ball grid array electronic package. It will shield the IC 18 from electromagnetic fields in harsh operating environments that may disrupt performance. The process is inexpensive and uses placement of a conductive body as a ball bond 32, in one example, on the edge conductive area 22 with a modified substrate 12 to accept the ball bond at those areas of the encapsulating material 28 at the edge conductive area of the substrate. It does not use an "EMI" can or other metal layer over the IC, nor does it require a number of grooves to be cut in any encapsulation material to expose leads such as located on the bottom of the substrate or molded into the package. Minor modifications to the substrate 12 may be required such as extending the ground trace 22 into these areas of the substrate 12 that will be cut so that any attached ball bonds 32 are exposed. This is a relatively minor modification to the substrate 12.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic package comprising:
   a substrate having opposing first and second surfaces;
   a plurality of conductive areas on the first surface of the substrate, the plurality of conductive areas comprising at least one edge conductive area at an edge of the substrate;
   a plurality of conductive bumps on the second surface of the substrate and coupled to respective ones of the plurality of conductive areas;
   an integrated circuit (IC) carried by the substrate;
   a plurality of bond wires coupled between the IC and respective ones of the plurality of conductive areas;
   an encapsulating material over the IC and adjacent portions of the substrate;
   a conductive layer on the encapsulating material; and
   a plurality of stacked solder ball sections coupled between the at least one edge conductive area and the conductive layer, wherein the conductive layer consists essentially of silver, wherein each of the plurality of stacked solder ball sections comprises a partial section of a solder ball, wherein the uppermost section of the plurality of stacked solder ball sections is covered with the encapsulating material, wherein each of the plurality of stacked solder ball sections comprises a sidewall contacting the conductive layer.

2. The electronic package according to claim 1 wherein said at least one edge conductive area comprises a ground trace.

3. The electronic package according to claim 1 wherein said conductive layer comprises a conductive paint.

4. The electronic package according to claim 1 wherein said conductive layer has a thickness between 5 to 15 microns.

5. The electronic package according to claim 1 wherein said conductive layer has a resistance no greater than 5 ohms per square.

6. An electronic package comprising:
   a substrate having opposing first and second surfaces;
   a plurality of conductive areas on the first surface of the substrate, the plurality of conductive areas comprising at least one ground trace at an edge of the substrate;
   a plurality of conductive bumps on the second surface of the substrate and coupled to respective ones of the plurality of conductive areas;
   an integrated circuit (IC) carried by the substrate;
   a plurality of bond wires coupled between the IC and respective ones of the plurality of conductive areas;
   an encapsulating material over the IC and adjacent portions of the substrate, the encapsulating material comprising a top surface and a sidewall;
   a conductive layer on the encapsulating material, the conductive layer covering the top surface and the sidewall of the encapsulating material; and
   a plurality of stacked solder ball sections coupled between the at least one ground trace and the conductive layer, wherein the conductive layer consists essentially of silver, wherein each of the plurality of stacked solder ball sections comprises a partial section of a solder ball, wherein the uppermost section of the plurality of stacked solder ball sections is covered with the encapsulating material with a region of the encapsulating material separating the uppermost section from the top surface of the encapsulating material, wherein each of the plurality of stacked solder ball sections comprises a sidewall contacting the conductive layer.

7. The electronic package according to claim 6 wherein said conductive layer comprises a conductive paint.

8. The electronic package according to claim 6 wherein said conductive layer has a thickness between 5 to 15 microns.

9. The electronic package according to claim 6 wherein said conductive layer has a resistance no greater than 5 ohms per square.

10. A method of forming an electronic package, the method comprising:
    forming a plurality of conductive areas on a first surface of a substrate, the plurality of conductive areas comprising at least one edge conductive area at an edge of the substrate, the substrate comprising a second surface opposite the first surface;

forming a plurality of stacked solder balls on the at least one edge conductive area;

forming a plurality of conductive bumps on the second surface of the substrate and coupled to respective ones of the plurality of conductive areas;

coupling a plurality of bond wires between an integrated circuit (IC) carried by the first surface of the substrate and respective ones of the plurality of conductive areas;

forming an encapsulating material over the IC and adjacent portions of the substrate, wherein the uppermost section of the plurality of stacked solder balls is covered with the encapsulating material;

cutting through the plurality of stacked solder balls to form a plurality of stacked solder ball sections, wherein each of the plurality of stacked solder ball sections comprises a partial section of a solder ball of the plurality of stacked solder balls; and forming a conductive layer consisting essentially of silver on the encapsulating material coupled to the at least one edge conductive area by the plurality of stacked solder ball sections, wherein each of the plurality of stacked solder ball sections comprises a sidewall contacting the conductive layer.

11. The method according to claim 10 wherein the at least one edge conductive area comprises a ground trace.

12. The method according to claim 10 wherein forming the conductive layer comprises applying a conductive paint.

13. The method according to claim 10 wherein the conductive layer has a thickness between 5 to 15 microns.

14. The method according to claim 10 wherein the conductive layer has a resistance no greater than 5 ohms per square.

15. The method according to claim 10, wherein the cutting is performed using a mechanical process, the cutting extending partially through one of the plurality of stacked solder balls, the method further comprising cutting, using a laser process, through the substrate after forming the conductive layer.

16. An electronic package comprising:
a substrate having opposing first and second surfaces and a first sidewall and an opposite second sidewall;
a plurality of conductive areas on the first surface of the substrate, the plurality of conductive areas comprising a ground trace at an edge of the substrate;
a plurality of conductive bumps on the second surface of the substrate and coupled to respective ones of the plurality of conductive areas;
an integrated circuit (IC) disposed over the substrate;
a plurality of bond wires coupled between the IC and respective ones of the plurality of conductive areas;
an encapsulating material over the IC and the substrate, the encapsulating material comprising a first sidewall and a second sidewall;
a solder ball section disposed over the ground trace, wherein the solder ball section is a partial section of a solder ball, the solder ball section comprising a sidewall; and
a conductive layer comprising essentially of silver disposed on the encapsulating material, the conductive layer covering the top surface of the encapsulating material, the first sidewall of the encapsulating material, and the first sidewall of the substrate, the conductive layer being disposed on a second sidewall of the encapsulant extending towards the solder ball section, the solder ball section being coupled between the ground trace and the conductive layer, wherein an upper portion of the sidewall of the solder ball section is covered with the conductive layer, wherein a lower portion of the sidewall of the solder ball section and an underlying second sidewall of the substrate remain exposed.

17. The electronic package according to claim 16 wherein said edge comprises a ground trace.

18. The electronic package according to claim 16 wherein said conductive layer comprises a conductive paint.

19. The electronic package according to claim 16 wherein said conductive layer has a thickness between 5 to 15 microns.

20. The electronic package according to claim 16 wherein said conductive layer has a resistance no greater than 5 ohms per square.

* * * * *